US012672418B2

(12) United States Patent
Leijtens et al.

(10) Patent No.: US 12,672,418 B2
(45) Date of Patent: Jun. 30, 2026

(54) STRONG OXIDE TRANSPORT LAYER WITH CLUSTERS AND GAP FILL LAYER

(71) Applicant: Swift Solar Inc., San Carlos, CA (US)

(72) Inventors: Tomas Leijtens, Redwood City, CA (US); Giles Eperon, Arvada, CO (US); Daniel Martinez, Wheat Ridge, CO (US)

(73) Assignee: Swift Solar Inc., San Carlos, CA (US)

( * ) Notice: Subject to any disclaimer, the term of this patent is extended or adjusted under 35 U.S.C. 154(b) by 0 days.

(21) Appl. No.: 18/433,078

(22) Filed: Feb. 5, 2024

(65) Prior Publication Data

US 2025/0255082 A1     Aug. 7, 2025

(51) Int. Cl.
H10K 30/40          (2023.01)
H10F 10/172        (2025.01)
H10F 71/00          (2025.01)

(52) U.S. Cl.
CPC ............. H10K 30/40 (2023.02); H10F 71/00 (2025.01); H10F 10/172 (2025.01)

(58) Field of Classification Search
CPC .............................. H10F 10/172; H10K 30/40
See application file for complete search history.

(56) References Cited

U.S. PATENT DOCUMENTS 11,462,688 B2   10/2022  Palmstrom et al.
11,864,399 B1 *   1/2024  Leijtens ................. H10K 30/85

2006/0025311 A1    2/2006  Brabec et al.
2015/0249170 A1 *  9/2015  Snaith ..................... H10F 77/14
                                                                              136/265
2016/0268510 A1 *  9/2016  Moon ..................... C07F 13/00
2017/0125172 A1 *  5/2017  Gong ................... H10K 85/215
2017/0229250 A1 *  8/2017  Guo ........................ H10K 30/20
2018/0075977 A1 *  3/2018  Huang ................... H10K 30/88
2022/0093865 A1 *  3/2022  Sugawara .............. H10K 85/40
2022/0285103 A1 *  9/2022  Shimo ................... H10K 71/12

FOREIGN PATENT DOCUMENTS

CN        113871556  A      12/2021
CN        117255575  A      12/2023
KR     1020230168209 A     12/2023
WO       2015085441  A1      6/2015
WO       2021010555  A1      1/2021

OTHER PUBLICATIONS

Bai (Year: 2015).*
Bai Supplemental (Year: 2015).*
Liu Supplemental (Year: 2022).*
Liu (Year: 2022).*

(Continued)

*Primary Examiner* — Sadie White
(74) *Attorney, Agent, or Firm* — Aikin & Gallant, LLP

(57)          ABSTRACT

Transport layers with clusters and a gap fill layer are described. In an embodiment, a solar cell includes a hole transport layer, a perovskite absorber layer and an electron transport layer. In such an embodiment, the electron transport layer includes clusters and a gap fill layer to improve the overall cohesion and mechanical strength of the transport layer while also maintaining good electrical performance.

19 Claims, 6 Drawing Sheets

(56) References Cited

OTHER PUBLICATIONS

Yang (Year: 2019).*
Gao (Year: 2010).*
Wolff (Year: 2023).*
Zhao (Year: 2021).*
Karst (Year: 2006).*
PCT/US2023/030799, "PCT Notification Concerning Transmittal of International Preliminary Report on Patentability", mailed Mar. 6, 2025, 6 pages.
PCT/US2023/030799, "PCT Notification of Transmittal of the International Search Report and the Written Opinion of the International Searching Authority, or the Declaration", mailed Jun. 21, 2024, 9 pages.
Stolterfoht "The impact of energy alignment and interfacial recombination on the internal and external open-circuit voltage of perovskite solar cells", from the journal: Energy & Environmental Science, Issue 9, 2019, 7 pages.
Gao "C60:LiF Blocking Layer for Environmentally Stable Bulk Heterojunction Solar Cells", Advanced Materials, vol. 22, Issue 47, p. 5404-5408, Oct. 26, 2010.
Savagatrup ("Mechanical degradation and stability of organic solar cells: Molecular and microstructural determinants") Energy Environ. Sci., 2015,8, 55-80 (Year: 2015).

Li ("Perovskite Tandem Solar Cells: From Fundamentals to Commercial Deployment") Chem. Rev. 2020, 120, 9835-9950 (Year: 2020).
Jayan ("Simulation and optimization studies on CsPbl3 based inorganic perovskite solar cells") Solar Energy 221 (2021) 99-108 (Year: 2021).
English machine translation of CN 113871556 A (Year: 2023).
Menzel ("Field Effect Passivation in Perovskite Solar Cells by a LiF Interlayer"), Adv. Energy Mater. 2022, 12, 2201109 (Year: 2022).
PCT/US2025/014041, "PCT Notification of Transmittal of the International Search Report and the Written Opinion of the International Searching Authority, or the Declaration", mailed May 19, 2025, 9 pages.
Liu-2013 ("Efficiency and stability enhancement of polymer solar cells using multi-stacks of C60/LiF as cathode buffer layer") Organic Electronics 14 (2013) 469-474 (Year: 2013).
Liu-2015 ("Triple Cathode Buffer Layers Composed of PCBM, C60, and LiF for High-Performance Planar Perovskite Solar Cells"). ACS Appl. Mater. Interfaces 2015, 7, 6230-6237 (Year: 2015).
Wu ("A Design Based on a Charge-Transfer Bilayer as an Electron Transport Layer for Improving the Performance and Stability in Planar Perovskite Solar Cells"). J. Phys. Chem. C 2018, 122, 236-244 (Year: 2018).

* cited by examiner

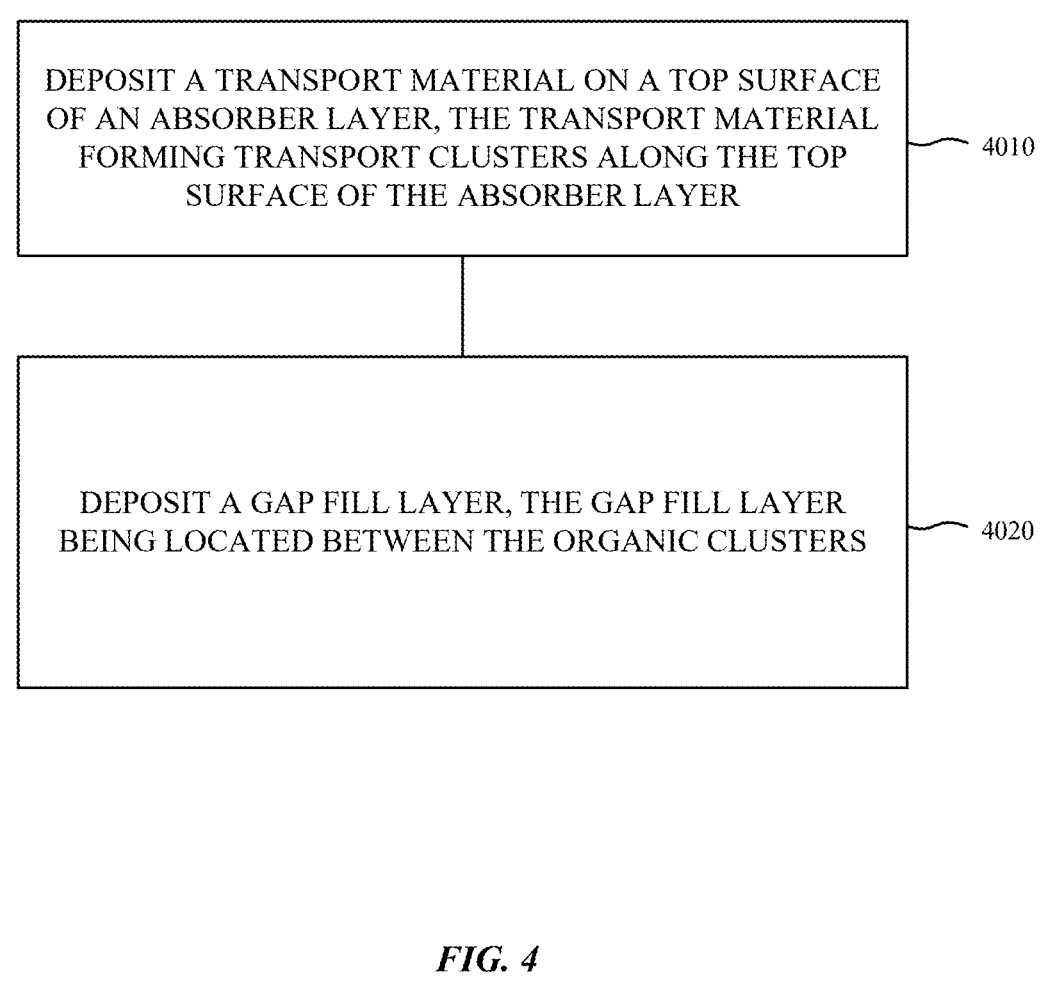

DEPOSIT A TRANSPORT MATERIAL ON A TOP SURFACE OF AN ABSORBER LAYER, THE TRANSPORT MATERIAL FORMING TRANSPORT CLUSTERS ALONG THE TOP SURFACE OF THE ABSORBER LAYER — 4010

DEPOSIT A GAP FILL LAYER, THE GAP FILL LAYER BEING LOCATED BETWEEN THE ORGANIC CLUSTERS — 4020

*FIG. 4*

STRONG OXIDE TRANSPORT LAYER WITH CLUSTERS AND GAP FILL LAYER

BACKGROUND

Field

Embodiments described herein relate to solar cells, and more particularly to electron transport layers.

Background Information

Photovoltaic cells, also referred to as solar cells, are devices that convert radiant photo energy into electrical energy. While monocrystalline solar cells are dominant in the current solar industry and offer some of the highest efficiencies and lifetimes, thin-film solar cells are gaining more attention due to the potential to implement economical in-line processes of deposition and patterning. Furthermore, some thin-film solar cells can be flexible with potential applications on curved surfaces, mobile devices, or other components. One such emerging thin-film technology is perovskite solar cells. Existing electron transport layers used in perovskite solar cells are commonly composed of single bulk material, often either $TiO_2$, $SnO_x$, or organic material such as C60 fullerene. The fullerene material in particular is a commonly used transport material when making perovskite solar cells for integration into tandem architectures.

SUMMARY

Embodiments describe solar cells and methods of fabrication. In an embodiment, a solar cell may include a first transport layer, an absorber layer, and a second transport layer, where the second transport layer includes transport clusters as well as a gap fill layer located between the transport clusters. In such instances, the transport cluster and the gap fill layer may provide complete coverage of the absorber layer, where the transport clusters provide a charge path between the absorber layer and a subsequent layer (e.g., buffer layer, etc.), and the gap fill layer serves to strengthen the second transport layer itself as well as strengthen its adhesion to surrounding layers, such as the absorbing layer, an optional buffer layer, etc.

BRIEF DESCRIPTION OF THE DRAWINGS

FIG. 4 is a process flow of a method for processing a solar cell with a transport layer that includes transport clusters and a gap fill layer in accordance with an embodiment.

DETAILED DESCRIPTION

Figure 1:
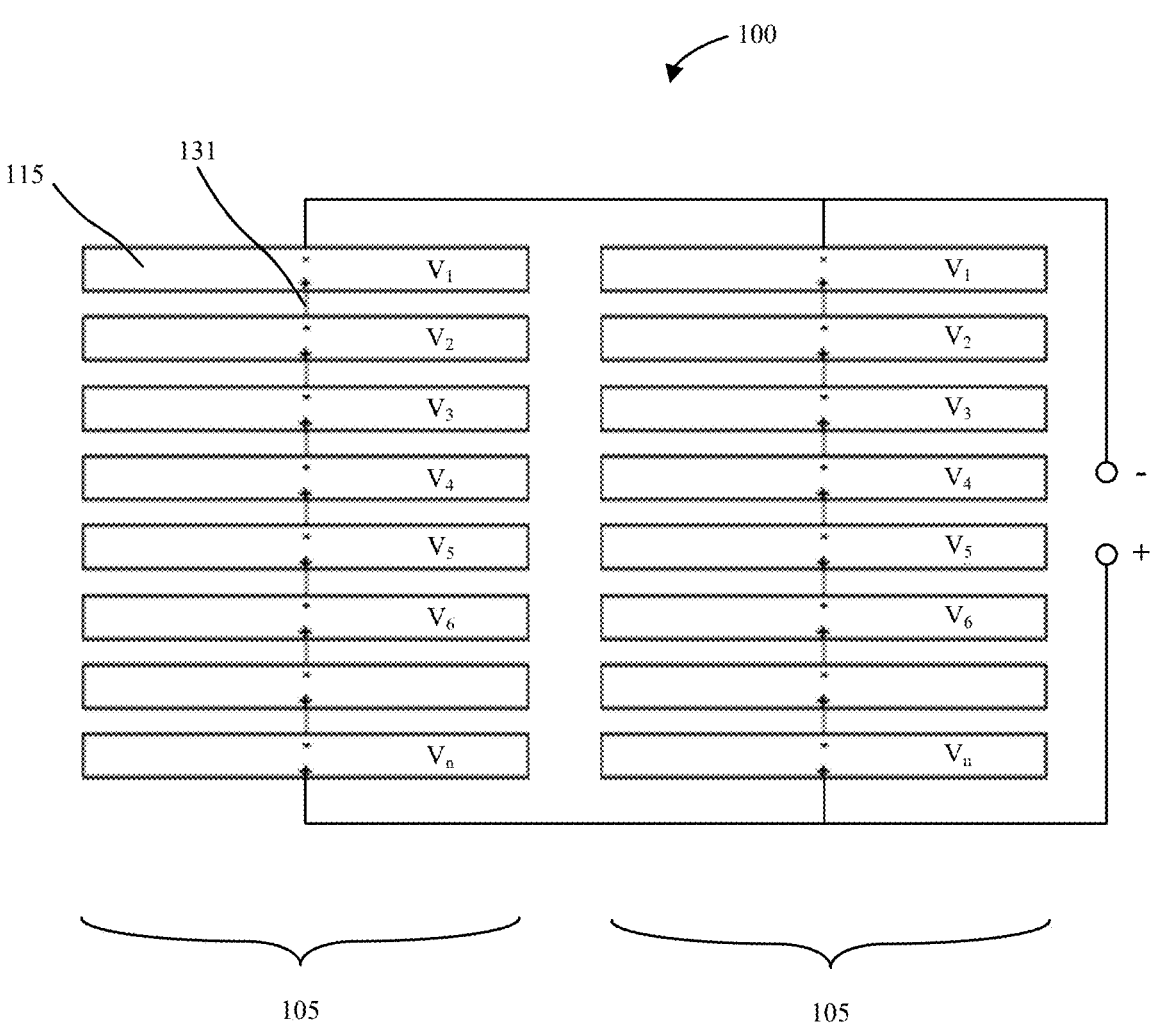
FIG. 1 is a schematic top view illustration of a solar cell module in accordance with embodiments.

The most common architecture for stable perovskite cells is the p-i-n architecture, which also allows for the most straightforward integration into tandem structures. In such architectures, a p-type hole transport layer (HTL) is first deposited, followed by a perovskite absorber layer, and then an n-type electron transport layer (ETL). Fullerene material (e.g., C60 fullerene) is a commonly used transport layer when making perovskite solar cells with the p-i-n architecture, where the ETL may be deposited after the perovskite absorber layer. It has been observed however that fullerene layers can be mechanically weak and provide a sub-optimal surface for nucleating subsequent layers. As a result, the ETL in this architecture may be the weakest layer in the solar cell and can be susceptible to delamination upon packaging or during operation. Oxide materials, such as $TiO_x$ and $SnO_x$ are commonly employed as single bulk ETLs in a reverse n-i-p architecture, where the ETL is deposited before the perovskite layer. Such ETL materials may have better mechanical properties than fullerene as well as good transport properties. However, in the p-i-n architecture it has been observed that the processes of depositing such oxide materials (e.g., sputtering, atomic layer deposition, etc.) may cause damage to an underlying perovskite surface, necessitating that an organic layer be inserted between the transport layer and the perovskite to protect the perovskite surface during the deposition process. Yet the most common organic layer that has achieved success in protecting the perovskite surface is fullerene, which raises the aforementioned delamination and mechanical issues.

In accordance with embodiments, perovskite solar cells are described in which transport layers include a combination of transport clusters with a gap fill layer. For example, the transport clusters may be first formed to provide a path for charge transport. The deposition technique, such as thermal evaporation, also does not damage the perovskite surface. The gap fill layer is then formed to cover any exposed perovskite surface area between the transport clusters. The gap fill layer may also partially or completely span over the transport clusters so that the transport clusters and the gap fill layer, in combination, protect the perovskite surface from the deposition of subsequent layers. In accordance with embodiments, the gap fill layer may adhere to the perovskite surface better than the fullerene material forming the transport clusters, and may also provide a better adhesive surface for deposition of additional metal oxide layer(s). In this manner the hybrid ETL including transport clusters and a gap fill layer may considerably improve the mechanical strength of the ETL itself and its adhesion to surrounding layers while also protecting the integrity of an underlying perovskite absorber layer.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semi-conductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1, a schematic top view illustration is provided of a solar cell module in accordance with embodiments. As shown, the solar cell module 100 includes a plurality of cells 115 (also referred to as solar cells) coupled in series by interconnects 131, with the front of one cell connected to the rear of the next cell so that their voltages add (e.g., $V_1$, $V_2$, $V_n$, etc.). The plurality of cells 115 may be arranged into one or more subsets 105 (e.g., strings) coupled in parallel, which may have the effect of decreasing total module voltage. Other arrangements, in which the second row of cells are aligned half a cell length off-center of the first row, the third row a half cell length from the second, etc., are also possible. In the latter, an entire row of several cells will be connected in parallel. This layout is sometimes referred to as a "matrix" or "brickwork" array.

Figure 2A:
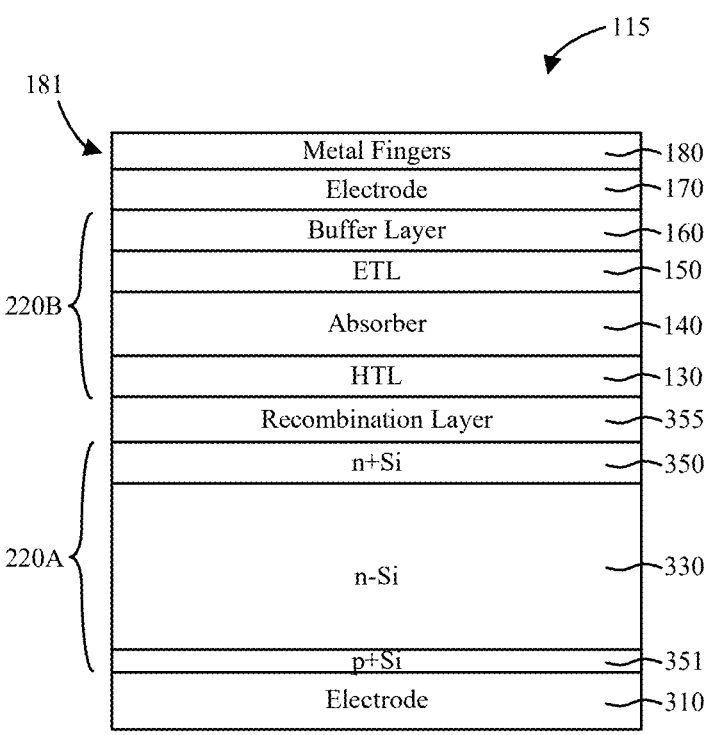
FIG. 2A is an illustrative diagram of a tandem solar cell stack-up in accordance with an embodiment.
Figure 2B:
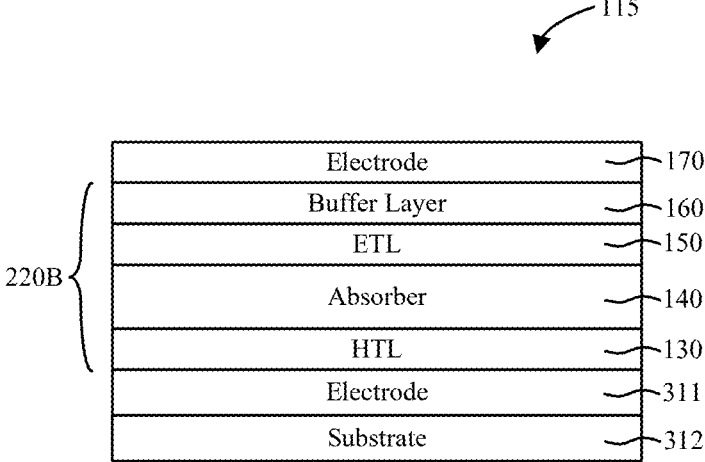
FIG. 2B is an illustrative diagram of a single junction solar cell in accordance with an embodiment.

Referring now to FIGS. 2A-2B, FIG. 2A is a silicon-perovskite tandem solar cell stack-up based on an n-type silicon substrate in accordance with embodiments; FIG. 2B is a single junction perovskite solar cell stack-up in accordance with an embodiment. In the following description, various layers and compositions are described for the solar cell stack-ups. It is to be appreciated that each layer may include a single layer, or multiple layers. In addition, reference to bottom or top layers herein is relative and may not be reflective of actual orientation in product. Furthermore, in the particular embodiments, the solar cells 115 may absorb light from the top side of the illustrated stack-ups similar to the embodiment illustrated in FIGS. 2A-2B, although the single junction solar cells 115, for example, may absorb light from the bottom side of the illustrated stack-ups. It is to be appreciated that while specific tandem and single junction solar cell stack-ups are illustrated in FIGS. 2A-2B that embodiments are not limited to these specific stack-ups, and that the hybrid ETLs described herein can be implemented into a variety of solar cell stack-ups.

Referring to FIG. 2A, the tandem structure may include a perovskite subcell 220B formed over a silicon subcell 220A, which may include a doped silicon substrate 330 (e.g., n-doped substrate), a p-doped silicon layer 351 (e.g., p+ doped), and optionally an n-doped silicon layer 350 (e.g., n+ doped). In other embodiments, the silicon subcell 220A of FIG. 2A may be formed over a p-doped silicon substrate rather than the n-doped silicon, where the p-doped silicon layer 351 may be optional as opposed to the n-doped silicon layer 350 being optional. It is to be appreciated that such exemplary silicon subcells can include a variety of configurations in accordance with all embodiments, including heterojunction (HJT) design, tunnel oxide passivated contacts (TOPCon), passivated rear contact solar cell (PERC), etc.

In the example of FIG. 2A, back side contact 310 (electrode) may be formed underneath p-doped silicon layer 351, where back side contact 310 may be formed of a suitable material such as Ag, Cr, Au, Cu, Al, etc. The p-doped silicon layer 351, as well as the n-doped silicon layer 350, may be crystalline, polycrystalline (such as with TOPCon design) or amorphous (such as with an HJT design). In such an HJT design, additional intrinsic layers (e.g., intrinsic silicon) may be formed between the doped silicon substrate 330 and each of the p-doped silicon layer 351 and/or the n-doped silicon layer 350. For example, the intrinsic layers may be formed by treating the doped silicon substrate 330, such as with hydrogen plasma, where the intrinsic layer(s) may also be crystalline or amorphous. Further, a recombination layer 355 may be formed over n-doped silicon layer 350 (between silicon subcell 220A and perovskite subcell 220B), where the recombination layer 355 may be formed of a transparent conducting material, such as a TCO or ITO specifically. In addition, the recombination layer 355 may be laterally or vertically conductive.

Perovskite subcell 220B may include an absorber layer 140 and one or more transport layers. In the embodiment illustrated, perovskite subcell 220B includes hole transport layer (HTL) 130 over the optional recombination layer 355, and electron transport layer (ETL) 150 over the absorber layer 140. In each of the embodiments described with regard to FIGS. 2A-2B, specific perovskite sub-cell stack-ups may include n-p, p-n, n-i-p, or p-i-n orientations. These changes in order of layer formation can additionally change materials selection of some layers without straying from the principles of the embodiments. Thus, reference to ETL or HTL and n-doped layer or p-doped layer may be reversed in accordance with embodiments.

HTL 130 may include one or more layers formed of a metal oxide such as nickel oxide ($NiO_x$) or vanadium oxide ($V_2O_5$), an organic polymer such as poly(triaryl amine) (PTAA), small molecules such as 2,2',7,7'-Tetrakis [N,N-di (4-methoxyphenyl)amino]-9,9'-spirobifluorene (spiro-MeO-TAD), or a "self-assembled monolayer" in which molecular assemblies can be formed spontaneously on surfaces by adsorption and then organized into large ordered domains. In one example, self-assembled monolayers can be formed where hole transporting moieties are attached to the underlying TCO or HTL layer via an acid binder group such as a phosphonic acid or carboxylic acid, although other compositions and methods of formation are contemplated. HTL 130 may additionally be doped to increase conductivity and may include a bi-layer of a metal oxide (e.g., $NiO_x$) and an organic layer such as PTAA or on top.

Absorber layer 140 is located over HTL 130. The absorber layer 140 in accordance with embodiments may be formed of a perovskite material. Perovskite materials may be characterized by the formula $ABX_3$, with A representing a large atomic or molecular cation (e.g., Cs, methylammonium, formamidinium, etc.), with B representing a positively charged cation (e.g., metal, lead, plumbate, Sn), and X representing a negatively charged anion (e.g., halide, I, Br, Cl). Perovskite materials can also include a mixture of 2D and 3D structures in the family of $A^1_m A_n B_{n-1} X3_{n-1}$ where $A^1$ represents a positively charged cation (e.g., butylammonium, phenethylammonium, guanidinium, etc.). Alternative materials such as organic materials can also be used as the absorber layer.

ETL 150 may be formed over absorber layer 140. ETL 150 in accordance with embodiments may be a hybrid layer including a first layer of transport clusters to provide charge transport, and a gap fill layer to complete coverage of the underlying absorber layer 140 and provide better strength to ETL 150 and adherence to absorber layer 140 than what can be achieved with the transport clusters. An optional buffer layer 160 may be included as part of or on top of ETL 150. For example, the buffer layer can physically separate the electrode layer, or top metal pattern, from the subcell, and more specifically the absorber layer. In an embodiment, the buffer layer is formed of a metal oxide material such as tin oxide, titanium diode, or aluminum zinc oxide (AZO) over ETL 150, where the buffer layer may function as a barrier layer as well as a charge transport layer. Electrode layer 170 may be formed directly over ETL 150 (or over optional buffer layer 160) and may include a suitable transparent conducting material (e.g., poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc.). Top metal pattern 181 may be formed over electrode layer 170 and may include a suitable conducting material (e.g., Ag, Cr, Au, Cu, Al, etc.), where top metal pattern 181 may be formed into a plurality of metal fingers 180 (and optionally a busbar connecting the plurality of metal fingers 180) so as to transport charge without overly blocking light transmission.

Typical charge transport layers used in perovskite solar cells are composed of a majority single bulk material, often either $TiO_2$, $SnO_x$, metal halides, napthalene diimide or organic materials such as C60 fullerene. Metal oxides such as $TiO_2$ and $SnO_x$ have both good transport properties and mechanical strength, but the metal-organic precursors used in atomic layer deposition (ALD) processes of most n-type semiconductors (including $TiO_2$ and $SnO_x$) react with the perovskite, which may cause damage to the perovskite surface. In addition, sputter deposition of such oxides may also cause damage to the perovskite surface. In accordance with embodiments, ETL 150 is formed over absorber layer 140 before the deposition of subsequent layers (e.g., buffer layer 160, electrode layer 170, etc.). In accordance with embodiments, the transport clusters of ETL 150 may be comprised of inorganic material, or organic material such as fullerene that may include "lower" fullerenes (e.g., C60 fullerene, etc.) as well as "higher" fullerenes. In addition, the transport clusters of ETL 150 may also include a fullerene blended with a metal halide (e.g., lithium fluoride (LiF), cesium fluoride (CsF), magnesium fluoride ($MgF_2$)), where metal halides such as LiF are hygroscopic and polar, and may adhere well to adjacent layers and help nucleate a subsequent CVD process for the deposition of subsequent layers (e.g., optional buffer layer 160, electrode layer 170, etc.). In some embodiments, the gap fill material may be comprised of an insulating material, such as $Al_2O_3$, which can provide a better surface for nucleating subsequent layers and possess stronger cohesion to itself and neighboring layers (e.g., absorber layer 140, optional buffer layer 160, etc.) than fullerene. In other embodiments, the gap fill material may be comprised of a semiconductor material or a metal oxide.

Referring now to FIG. 2B, a single junction solar cell may include a perovskite subcell 220B as previously described with regard to FIG. 2A. The perovskite subcell 220B may be formed over a bottom electrode layer 311 and substrate 312. For example, the bottom electrode may be formed of a suitable material such as a TCO. Substrate 312 may be a transparent substrate for a bottom emission structure. Electrode layer 170 may be formed over the perovskite subcell 220B and may be formed of a suitable metal material for a bottom emission structure, or TCO for example with a top emission structure. Similarly, metal fingers such as those described in FIG. 2A can optionally be formed over electrode layer 170.

Figure 3A:
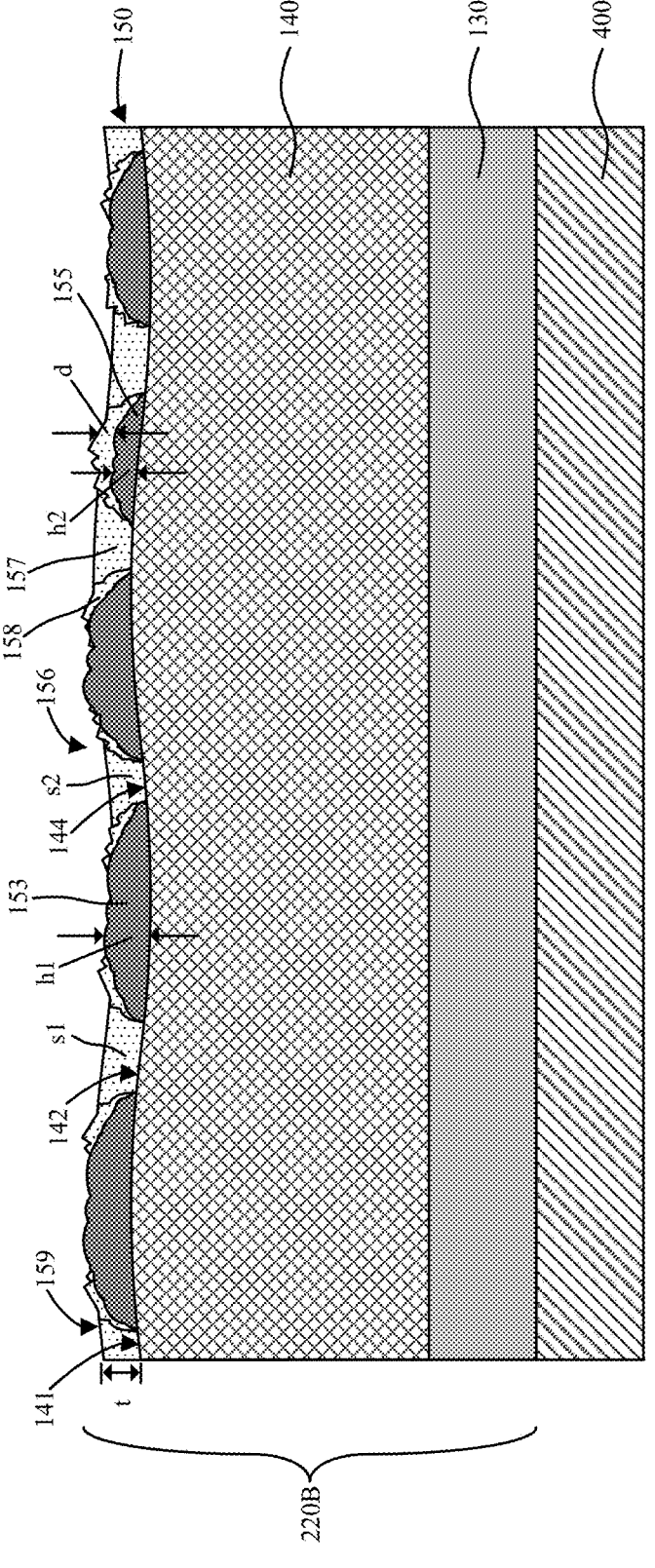
FIG. 3A is a schematic cross-sectional side view illustration of an exemplary solar cell with a transport layer that includes transport clusters and a gap fill layer in accordance with an embodiment.
Figure 3B:
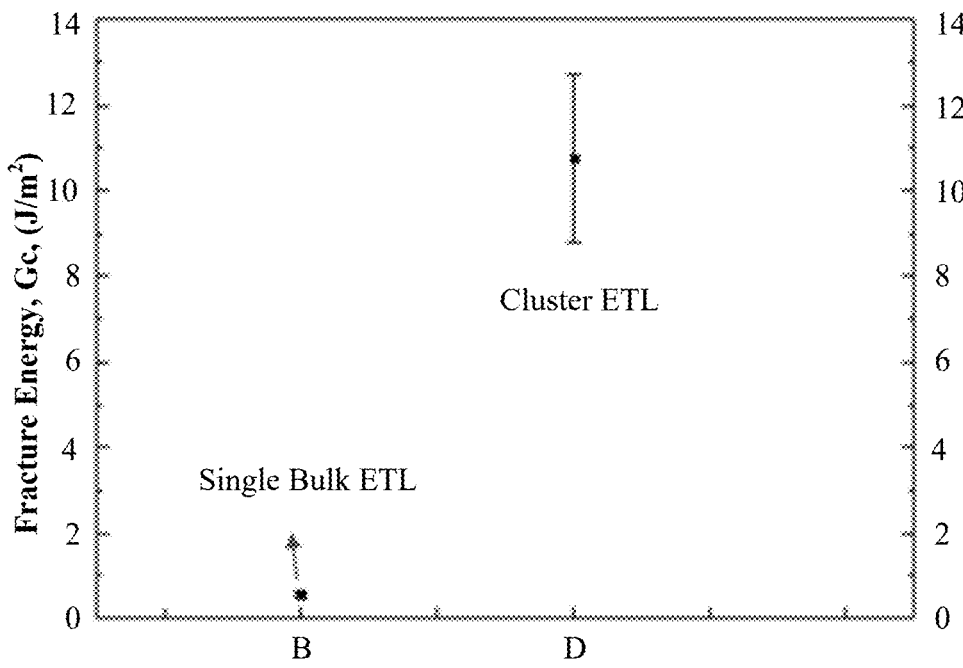
FIG. 3B is a graphical representation of the fracture energy of an exemplary solar cell with a transport layer that includes transport clusters and a gap fill layer as compared to a majority single bulk material solar cell.
Figure 3C:
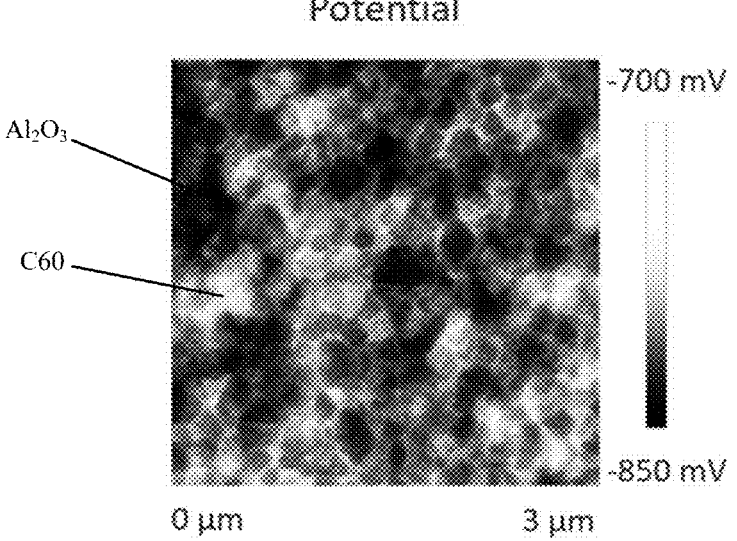
FIG. 3C is a top view microscopy image of an exemplary solar cell with a transport layer that includes transport clusters and a gap fill layer in accordance with an embodiment.

Referring now to FIGS. 3A-3C, FIG. 3A illustrates a perovskite solar cell that includes a transport layer with transport clusters and a gap fill layer; FIG. 3B illustrates a graph that shows the fracture energy of a transport layer in accordance with the embodiment described in FIG. 3A as compared to the fracture energy of a transport layer with a majority single bulk material; FIG. 3C illustrates a top view microscopy image of a transport layer in accordance with the embodiment described in FIG. 3A. FIG. 3A shows a finer view of perovskite subcell 220B described in FIG. 2A-2B, in particular a finer view of ETL 150. In the example of FIG. 3A perovskite subcell 220B is formed over substrate 400 (e.g., TCO-coated silicon subcell, TCO-coated transparent substrate, etc.) and includes HTL 130 over substrate 400, absorber layer 140 over HTL 130, and ETL 150 over absorber layer 140.

In further reference to FIG. 3A, ETL 150 may include transport clusters as well as a gap fill layer, where the transport clusters primarily provide charge transport properties to ETL 150 and the gap fill layer primarily improves the mechanical strength of ETL 150. For example, the gap fill layer not only provides improved adhesive strength of ETL 150 to its surrounding layers (e.g., absorber layer 140, optional buffer layer 160, electrode layer 170, etc.) but also improved resilience to internal fracture within ETL 150 itself. In this way, the transport clusters and the gap fill layer of ETL 150, in combination, provide the electrical properties of a transport layer but with improved mechanical robustness overall to help prevent delamination issues.

In the example of FIG. 3A, ETL 150 may include multiple transport clusters, such as transport clusters 153, 155, with gap fill layer 156 located between the transport clusters and in some instances overlaying the transport clusters. The transport clusters may be composed of inorganic material or organic material that enables charge transport through perovskite subcell 220B without causing damage to the perovskite surface, such as fullerene (e.g., C60 fullerene, etc.) or a fullerene blend. A C60 fullerene layer, for example, may be formed by vacuum-deposition, whereas other fullerene compositions or organic photovoltaics may be similarly formed by vacuum-deposition or solution-deposition. The gap fill layer may be composed of inorganic material that adheres to absorber layer 140 without causing damage to the perovskite surface, and also provides a good surface for nucleating subsequent layers (e.g., optional buffer layer 160), such as $Al_2O_3$. In an embodiment the gap fill layer is formed by atomic layer deposition. In one example, while the gap fill material (e.g., $Al_2O_3$) may adhere well to the perovskite surface during the atomic layer deposition process, it may not adhere as well to the transport clusters (e.g., C60 fullerene clusters), which may cause the gap fill layer to form via multiple modes of growth. For example, the gap fill layer may include layer-by-layer type growth over the perovskite surface (e.g., Frank-van der Merwe growth), as well as cluster or island-type growth over the transport clusters (e.g., Volmer-Weber growth). In another example, the gap fill layer may grow preferentially on the perovskite surface and may not grow on the transport clusters until the perovskite surface is fully saturated.

Upon deposition of the transport material (e.g., fullerene), "islands" or transport clusters may form based on the average layer thickness of the material deposited, the manner of deposition, the strength of the organic-perovskite surface interactions and the effective hydrophobicity. In accordance with embodiments, transport material (e.g., fullerene) may be deposited using thermal evaporation. For example, where an amount of material is evaporated to form a layer above a particular average layer thickness (e.g., 5 nm), the deposited material May form a continuous layer over absorber layer 140. Conversely, where an amount of material is evaporated to form a layer below a particular average layer thickness (e.g., 5 nm), the deposited material may form islands or clusters. This may be attributed to the material, such as C60 fullerene, having low affinity for the perovskite surface onto which it is deposited. The dimensions of the transport clusters formed (e.g., size, shape, etc.) may vary based on the type of material deposited (e.g., C60 fullerene, etc.), the amount of material deposited (e.g., thickness, number of cycles, etc.), the type of surface upon which the material is deposited (e.g., perovskite, etc.), the manner of deposition, etc. In accordance with embodiments, thermal evaporation of the material may form a non-uniform layer of transport clusters, such as transport clusters 153, 155, where some islands or transport clusters may have a height greater than the average layer thickness (e.g., transport cluster 153), and other islands or transport clusters may have a height less than the average layer thickness (e.g., transport cluster 155), as illustrated in FIG. 3A.

Further, gap fill material may be subsequently deposited to form gap fill layer 156, where the gap fill material occupies empty space between the transport clusters and, in some instances, overlays the transport clusters. As such, the transport clusters and the gap fill layer of ETL 150, in combination, provide complete coverage of top surface 141 of absorber layer 140. Furthermore, the gap fill layer may be formed using a suitable technique to provide mechanical adherence to surrounding layers and to also provide a mechanical buffer over the absorber layer 140 to protect from subsequent processes, while not substantially degrading the electrical performance of the ETL 150. In an embodiment, the gap fill layer is formed using atomic layer deposition, where precursor chemistry is selected for compatibility with perovskite. In an embodiment, an alumina ($Al_2O_3$) gap fill layer is formed by sequential exposure to trimethylaluminum (TMA) and an oxidizer such as water or ozone. Further, the alumina gap fill layer may include layered sections of alumina formed over the perovskite surface in a layer-by-layer fashion (e.g., Frank-van der Merwe growth), as well as gap fill clusters of alumina formed over the transport clusters (e.g., Volmer-Weber growth). For example, in reference to FIG. 3A, the gap fill layer may grow over the perovskite surface in a layer-by-layer fashion such as layered section 157, which may conform to the perovskite surface below and create a mechanically strong adhesion region between the perovskite surface and the gap fill layer as well as mechanically strong cohesion within the gap fill layer itself. In addition, the gap fill layer may also grow over portions of the transport clusters (and possibly over the entirety of one or more transport clusters). In such instances, the gap fill material (e.g., $Al_2O_3$) may not grow as well over the transport clusters (e.g., C60 fullerene clusters) or may only grow after the perovskite surface is fully saturated, which may cause the formation of gap fill clusters, such as gap fill cluster 158, which may create a mechanically weak adhesion region between the transport clusters and the gap fill clusters.

The electrical and mechanical performance of ETL 150 may depend on how the transport clusters and the gap fill layer are structured with respect to one another. In one aspect, the electrical performance of ETL 150 (e.g., charge transport performance) may relate to the height of each respective transport cluster in relation to a particular thickness of the gap fill layer. Based on how the transport clusters form, the height of each respective cluster may be greater or less than the average layer of thickness of the deposited layer. For example, where the average layer thickness of the deposited organic layer is 3 nm across the underlying absorber layer 140, some transport clusters may form to have a 4 nm height, whereas other transport clusters may form to have a 2 nm height. Referring to the example of FIG. 3A, transport cluster 153 has a height of h1 and transport cluster 155 has a height of h2, where h1 is greater than h2. The ability of these clusters to transfer charge may relate, in part, to the thickness of the gap fill layer. In some embodiments, where the gap fill material is an insulator, gap fill layer 156 may limit the transport properties of the transport clusters, especially where gap fill layer 156 spans over an entirety of a transport cluster. In other embodiments, where the gap fill layer material is conductive, the conductive characteristics of the gap fill material may mitigate any limiting effects the thickness of gap fill layer 156 may have on the electrical performance of ETL 150.

In further reference to FIG. 3A, gap fill layer 156 may have an average layer thickness, t, that spans from top surface 141 of absorber layer 140 to gap fill surface 159. The contours of gap fill layer 156 may closely approximate the contours top surface 141 of absorber layer 140 due to the conformal nature of ALD. Further, the morphology of the gap fill layer may also depend upon the ALD growth cycle and surface reactions. It is expected that the ALD process may proceed more efficiently over the exposed perovskite surface than the C60 clusters. Referring to the example of FIG. 3A, transport cluster 153 is not completely covered by gap fill layer 156, so charge transport may occur freely between transport cluster 153 and any subsequent layer (e.g., buffer layer 160, etc.) since transport cluster 153 and any subsequent layer may come into direct contact with one another. In such instances, gap fill layer 156 spans over at least a portion, but not an entirety, of transport cluster 153. In another example, transport cluster 155 is covered by gap fill layer 156, where gap fill layer 156 covers or spans over an entirety of transport cluster 155 and prevents direct contact between transport cluster 155 and any subsequent layer. Where gap fill layer 156 is composed of an insulator material, such as $Al_2O_3$, gap fill layer 156 may diminish or altogether prevent charge transfer between transport cluster 155 and any subsequent layer, which may diminish the electrical performance of ETL 150. As such, in some embodiments, the deposition of gap fill material may be controlled so that the distance, d, between transport cluster 155 and a portion of gap fill surface 159 that spans over transport cluster 155 allows charge transport to occur via "tunneling" through gap fill layer 156. In other embodiments, the deposition of gap fill material may be controlled so that the average layer thickness, t, of gap fill layer 156 is less than (or equal to) the height of the lowest cluster (e.g., height h2 of transport cluster 155) so that every transport cluster has direct contact with a subsequently deposited layer.

In another aspect, the mechanical performance of ETL 150 may depend on the amount of space between transport clusters. Referring to FIG. 3A, exposed portion 142 of absorber layer 140 includes space s1 between transport clusters, and exposed portion 144 of absorber layer 140 includes space s2 between transport clusters, where s1 is greater than s2 (e.g., greater surface area, etc.). In such instances, more gap fill material may be deposited in space s1 than in space s2, and consequently the adhesion/cohesion of gap fill layer 156 in exposed portion 142 (both to its surrounding layers as well as to itself) may be stronger than the adhesion/cohesion of gap fill layer 156 in exposed portion 144. In some instances, where multiple transport clusters, such as C60 fullerene clusters, connect so that no portion of absorber layer 140 is exposed, the gap fill material, such as $Al_2O_3$, may not grow well (or at all) over the connected portions of the transport clusters, which may weaken the mechanical strength in that particular portion of ETL 150. It should be noted that gap fill layer 156 not only improves the mechanical performance of ETL 150 by strengthening the adhesion of ETL 150 to its surrounding layers (e.g., absorber layer 140, buffer layer 160, etc.) but also by strengthening the cohesion of ETL 150 within itself to improve resilience to internal fracture and prevent delamination.

Referring now to FIG. 3B, a graph represents the fracture energy for a majority single bulk material ETL ("Single Bulk ETL") as compared to the fracture energy for an ETL that includes transport clusters and a gap fill layer ("Cluster ETL"), such as the example of ETL 150 described in FIG. 3A. The single bulk ETL test specimen B was prepared by thermal evaporation of a 25 nm average thickness layer of C60 fullerene onto a first oxide-coated glass substrate, a silver layer deposited over the C60 fullerene layer, and a second glass substrate epoxied to the silver layer. The cluster ETL test specimen D was prepared by thermal evaporation of organic material onto a first glass substrate to form transport clusters in accordance with embodiments, an insulator material deposited as the gap fill layer on a first glass substrate and between transport clusters in accordance with embodiments, a 15 mm thick $SnO_x$ layer deposited over the transport cluster/gap fill layer, a silver layer deposited over the $SnO_x$ layer and a second glass substrate epoxied to the $SnO_x$ layer. For the single bulk ETL fracture energy tests, which measure the force required to "peel" the first and second glass substrates apart, the single bulk ETL measured fracture energies in the range of 0.5 $J/m^2$, with some segments of the single bulk ETL adhering to the first glass substrate and other segments of the single bulk ETL adhering to the second glass substrate. For the cluster ETL, the fracture test measured a fracture energy in the range of 11 $J/m^2$ with the entire cluster ETL layer remaining intact, suggesting good cohesion within the layer itself. Overall, this demonstrates an approximately 20× increase.

Referring now to FIG. 3C, a top view microscopy image shows a transport layer in accordance with the embodiment described in FIG. 3A. The microscopy image was captured by Kelvin Probe Force Microscopy ("KPFM"), which measures the local contact potential difference between a conducting atomic force microscopy tip and a sample, thereby mapping the work function or surface potential of the same with high spatial resolution. For the sample imaged in FIG. 3C, a perovskite layer was formed over a TCO-coated glass substrate. In addition, the sample includes a transport layer formed over the perovskite layer. Similar to ETL 150 described in the example of FIG. 3A, the transport layer included organic clusters and a gap fill layer. As shown in FIG. 3C, the KPFM image shows clustering of the C60 (lighter regions) with growth of $Al_2O_3$ (darker regions) between the C60 clusters.

Figure 5A:
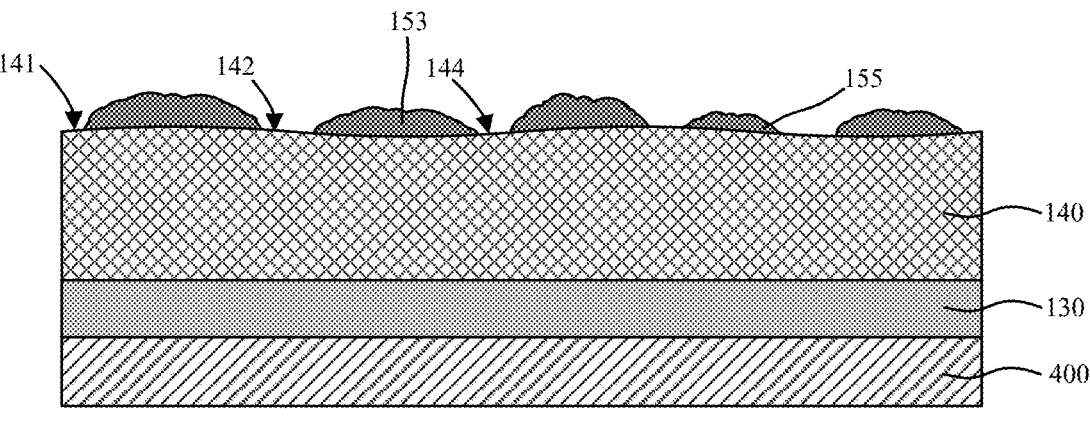
FIG. 5A-5C are schematic cross-sectional side view illustrations of a method of forming an exemplary solar cell with a transport layer that includes transport clusters and a gap fill layer.
Figure 5B:
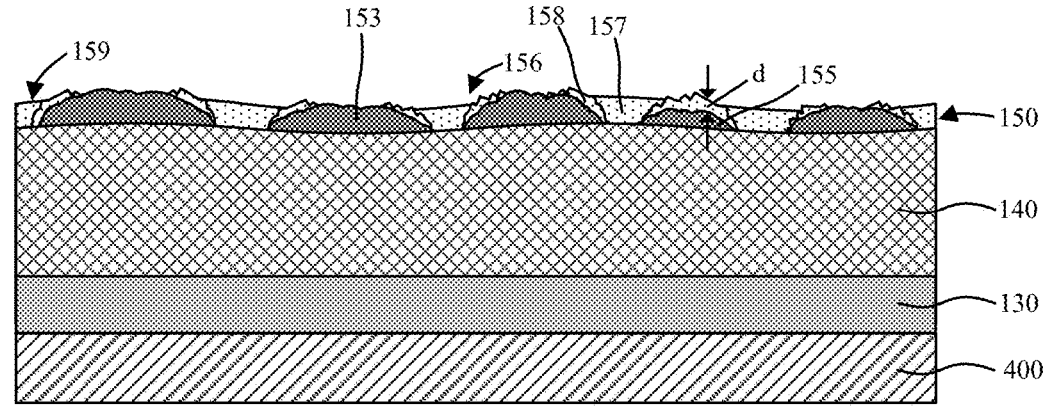
Figure 5C:
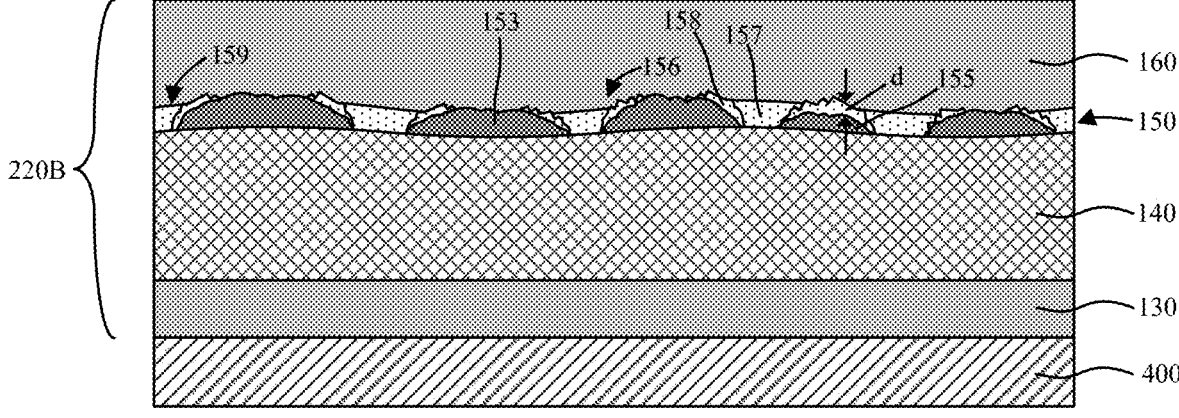

FIG. 4 is a flow chart and FIGS. 5A-5C are schematic cross-sectional side view illustrations of a method of forming exemplary ETL 150 described in FIG. 3A. In the interest of clarity and conciseness, the method of FIG. 4 is described concurrently with the illustrations of FIGS. 5A-5C. As shown in FIG. 5A, the process sequence can begin at operation 4010 by depositing organic material (e.g., C60 fullerene) to form transport clusters, such as transport clusters 153, 155, on top surface 141 of absorber layer 140. Organic material, such as C60 fullerene, may be deposited by thermal evaporation, where other fullerene compositions or organic photovoltaics may be similarly deposited or solution-deposited. The organic material may be deposited so as to not form a continuous layer but rather to cause the material to form "islands" or clusters, such as transport clusters 153, 155, that may cover portions of top surface 141, while leaving other portions of top surface 141 exposed, such as exposed portions 142, 144. This may be due to surface properties and C60 fullerene having greater affinity for itself than perovskite. In some embodiments, such deposition may be achieved by controlling the thickness of the deposition layer. For example, where the deposited layer is below a particular average layer thickness (e.g., less than 5 nanometers, etc.), the deposited material may cluster together to form "islands" or clusters, such as transport clusters 153, 155, as illustrated in FIG. 5A, without forming a continuous layer.

Referring now to FIG. 5B, at operation 4020 gap fill material may be deposited (e.g., atomic layer deposition, etc.) on top surface 141 between the transport clusters (such as exposed portions 142, 144) to form gap fill layer 156, where the gap fill layer may form in a layer-by-layer fashion over the top surface 141 of absorber layer 140 (e.g., layered section 157), and may also form into islands or gap fill clusters over the transport clusters (e.g., gap fill cluster 158). In some embodiments, gap fill material may be deposited so that gap fill layer 156 spans over the transport clusters (either partially or entirely). In such instances, the deposition of the gap fill material may be controlled so that a distance, d, between a portion of the transport clusters, such as the top or "peak" of transport cluster 155, and a portion of the surface of gap fill layer 156, such as the portion of gap fill surface 159 that spans over the transport clusters, allows for charge transport to occur through gap fill layer 156 via "tunneling." In addition, it is contemplated that due to the conformality of atomic layer deposition, gap fill surface 159 of gap fill layer 156 may include curves and undulations that approximately correspond to the curves and undulations of the underlying transport clusters and/or top surface 141 of absorber layer 140.

In FIG. 5C, an optional buffer layer 160 (e.g., tin oxide, etc.) may be formed over ETL 150 by atomic layer deposition, sputtering, or chemical vapor deposition at low temperatures, etc. The thickness of buffer layer 160 may range from approximately 5-50 nanometers. During the deposition process, the metal oxide may adhere to the gap fill material of gap fill layer 156 to establish a mechanical connection between ETL 150 and buffer layer 160. In addition, where the transport clusters are not completely covered by the gap fill layer, the metal oxide of buffer layer 160 may have direct contact with the transport clusters to establish an electrical connection between ETL 150 and buffer layer 160. As such, the characteristics of the transport clusters (e.g., material type, layer thickness, etc.) must be balanced with the characteristics of the gap fill layer (e.g., material type, layer thickness, etc.) in order to obtain the desired electrical and mechanical properties of ETL 150, where the enhanced mechanical stability of ETL 150 relates not only to the its enhanced adhesion to surrounding layers (e.g., absorber layer 140) but also to enhanced cohesion within the ETL itself.

In utilizing the various aspects of the embodiments, it would become apparent to one skilled in the art that combinations or variations of the above embodiments are possible for forming a transport layer that includes transport clusters and gap fill layer. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell comprising:
a substrate;
a first transport layer over the substrate;
an absorber layer over the first transport layer; and
a second transport layer over the absorber layer;
wherein the second transport layer comprises fullerene-containing transport clusters and an alumina gap fill layer that is grown between the fullerene-containing transport clusters and over a portion of the fullerene-containing transport clusters such that the alumina gap fill layer is thicker between the fullerene-containing transport clusters than over the fullerene-containing transport clusters.

2. The solar cell of claim 1, wherein the substrate comprises a silicon subcell.

3. The solar cell of claim 1, wherein the absorber layer comprises perovskite.

4. The solar cell of claim 1, wherein some of the fullerene-containing transport clusters are characterized by a height that is greater than an average layer thickness of the alumina gap fill layer.

5. The solar cell of claim 1, wherein the fullerene-containing transport clusters comprise fullerene blended with a metal halide.

6. The solar cell of claim 1, wherein a buffer layer is formed over the second transport layer.

7. The solar cell of claim 6, wherein the buffer layer comprises a metal oxide.

8. The solar cell of claim 7, wherein the fullerene-containing transport clusters provide a charge path between the absorber layer and the buffer layer.

9. The solar cell of claim 1, wherein a top portion of the fullerene-containing transport clusters is not completely covered by the gap fill material.

10. The solar cell of claim 9, further comprising a buffer layer over the second transport layer, wherein the buffer layer is in direct contact with the top portion of the fullerene-containing transport clusters.

11. The solar cell of claim 1, wherein the fullerene-containing transport clusters and the alumina gap fill layer, in combination, provide complete coverage of a top surface of the absorber layer.

12. A method for processing a solar cell comprising:
forming a first transport layer over a substrate;
forming an absorber layer over the first transport layer; and
forming a second transport layer over the absorber layer, wherein forming the second transport layer includes:
depositing a fullerene-containing transport material on a top surface of the absorber layer, the fullerene-containing transport material forming fullerene-containing transport clusters along the top surface of the absorber layer; and
growing an alumina gap fill layer between the fullerene-containing transport clusters and over a portion of the fullerene-containing transport clusters such that the alumina gap fill layer is thicker between the fullerene-containing transport clusters than over the fullerene-containing transport clusters.

13. The method of claim 12, wherein the substrate comprises a silicon subcell.

14. The method of claim 12, wherein the absorber layer comprises perovskite.

15. The method of claim 12, wherein the fullerene-containing transport material is deposited with a thermal evaporation technique.

16. The method of claim 12, wherein the alumina gap fill layer is grown with atomic layer deposition.

17. The method of claim 12, wherein the fullerene-containing transport clusters and the alumina gap fill layer, in combination, provide complete coverage of the top surface of the absorber layer.

18. The method of claim 12, further comprising forming a buffer layer over the second transport layer, the buffer layer comprising a metal oxide.

19. The method of claim 18, where the transport clusters provide a charge path between the absorber layer and the buffer layer.

* * * * *